(12) United States Patent
Shrivastava

(10) Patent No.: US 12,267,055 B2
(45) Date of Patent: Apr. 1, 2025

(54) ISOLATOR CIRCUIT

(71) Applicant: TEXAS INSTRUMENTS INCORPORATED, Dallas, TX (US)

(72) Inventor: Kumar Anurag Shrivastava, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 18/179,482

(22) Filed: Mar. 7, 2023

(65) Prior Publication Data

US 2024/0305274 A1   Sep. 12, 2024

(51) Int. Cl.
| | | |
|---|---|---|
| *H03H 11/02* | (2006.01) | |
| *H03K 5/01* | (2006.01) | |
| *H03K 19/21* | (2006.01) | |
| *H03K 5/00* | (2006.01) | |

(52) U.S. Cl.
CPC ............ *H03H 11/02* (2013.01); *H03K 5/01* (2013.01); *H03K 19/21* (2013.01); *H03K 2005/00013* (2013.01)

(58) Field of Classification Search
CPC .......... H03H 11/02; H03K 5/01; H03K 19/21; H03K 2005/00013
USPC ....................................................... 327/551
See application file for complete search history.

(56) References Cited

U.S. PATENT DOCUMENTS

| | | | | |
|---|---|---|---|---|
| 6,538,342 B1* | 3/2003 | Tsai | ............... | H02M 3/33561 |
| | | | | 307/34 |
| 7,239,530 B1* | 7/2007 | Djekic | ............. | H02M 3/33592 |
| | | | | 363/16 |
| 7,463,498 B1* | 12/2008 | Djekic | ............. | H02M 3/33592 |
| | | | | 363/16 |
| 8,068,355 B1* | 11/2011 | Ikriannikov | ......... | H02M 3/285 |
| | | | | 363/16 |
| 10,340,807 B2* | 7/2019 | Chen | ................ | H02M 3/33546 |
| 2002/0125941 A1* | 9/2002 | Nguyen | ................ | H03F 3/393 |
| | | | | 330/10 |
| 2011/0122165 A1* | 5/2011 | Sengoku | ............... | G09G 3/342 |
| | | | | 315/276 |
| 2013/0106365 A1* | 5/2013 | Ang | ....................... | B60L 1/003 |
| | | | | 320/138 |
| 2021/0234473 A1* | 7/2021 | Alnajjar | ............. | H02M 7/4807 |
| 2023/0112281 A1* | 4/2023 | Yuzurihara | ........... | H03F 1/0211 |
| | | | | 330/251 |

* cited by examiner

*Primary Examiner* — Ryan Jager
(74) *Attorney, Agent, or Firm* — Valerie M. Davis; Frank D. Cimino

(57) ABSTRACT

In some examples, an apparatus includes an isolating transformer and a grounding circuit. The isolating transformer has first and second coils separated by an isolation barrier, the first coil having first and second terminals. The grounding circuit is coupled to the first and second terminals. The grounding circuit is configured to couple the first and second terminals to a ground terminal during a first time period. The grounding circuit is also configured to decouple the first and second terminals from the ground terminal during a second time period.

20 Claims, 5 Drawing Sheets

ISOLATOR CIRCUIT

BACKGROUND

In various devices, approaches are implemented to provide signal isolation. The signal isolation may isolate a signal provided in a first portion of the device from reaching a second portion of the device, while still allowing data included in the signal to be provided to the second portion. Multiple approaches may exist for signal isolation.

SUMMARY

In some examples, an apparatus includes an isolating transformer, a first resistor, a second resistor, a first switch, a second switch, and a control circuit. The isolating transformer has a first coil, the first coil having first and second terminals. The first resistor has first and second terminals, the first terminal of the first resistor coupled to the first terminal of the first coil. The second resistor has first and second terminals, the first terminal of the second resistor coupled to the second terminal of the first coil. The first switch has a control terminal, having a first terminal coupled to the second terminal of the first resistor, and having a second terminal coupled to a ground terminal. The second switch has a control terminal, having a first terminal coupled to the second terminal of the second resistor, and having a second terminal coupled to the ground terminal. The control circuit is coupled to the first terminal of the first coil and coupled to the control terminals of the first and second switches.

In some examples, an apparatus includes an isolating transformer and a grounding circuit. The isolating transformer has first and second coils separated by an isolation barrier, the first coil having first and second terminals. The grounding circuit is coupled to the first and second terminals. The grounding circuit is configured to couple the first and second terminals to a ground terminal during a first time period. The grounding circuit is also configured to decouple the first and second terminals from the ground terminal during a second time period.

In some examples, a method includes receiving a signal having an asserted value, releasing grounding of a transformer coil responsive to the signal having the asserted value, and grounding the transformer coil a programmed period of time after the releasing.

DETAILED DESCRIPTION

Figure 1:
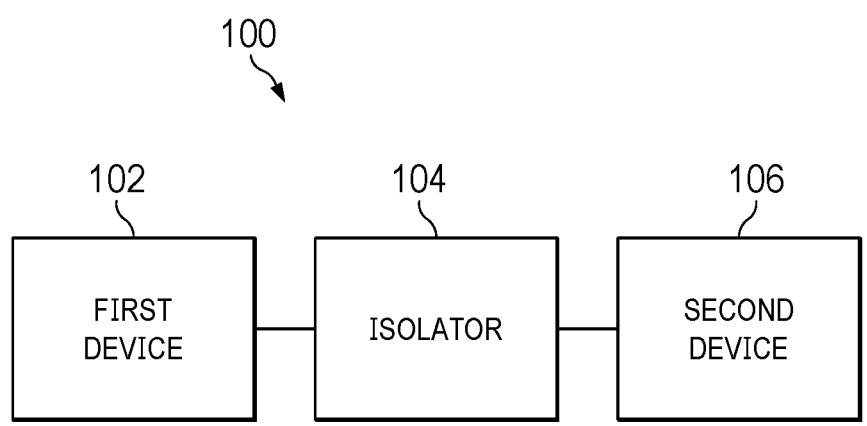
FIG. 1 is a block diagram of an example system for implementing voltage isolation.

In various devices, approaches are implemented to provide signal isolation. The signal isolation may isolate a signal provided in a first portion of the device from reaching a second portion of the device, while still allowing data included in the signal to be provided to the second portion. One such approach to signal isolation is an isolator circuit that includes an isolating transformer. For example, a signal including data may be electrically coupled from the first portion of the device across an isolation barrier to the second portion of the device using an isolating transformer, while preventing the signal itself from being provided from the first portion of the device to the second portion of the device. Namely, the isolating device, such as an isolating transformer, provides galvanic isolation to prevent direct current flow between the first and second portions of the device, but still allow data exchange by other means such as capacitive, inductive, radiative, optical, or acoustic coupling, for example. Such approaches may be useful for safety or protection applications, such as scenarios in which the signal may have a voltage or current value with a potential to be harmful to components of the second portion of the device or a user who may come into contact with the second portion of the device.

In many application environments, the isolating transformer is affected by an external electric field, such as created by electromagnetic interference (EMI). The EMI may result in the presence of noise in signals input to, or received from, the isolating transformer. In some implementations of the isolating transformer, this noise may create a common mode (CM) voltage having a peak-to-peak value sufficiently large to create challenges for accurate signal transmission or detection. For example, the CM peak-to-peak voltage (Vpp) may have a value sufficiently large to cause saturation of the isolating transformer and/or supporting components of the isolating transformer. The saturation may cause a noise component of the signal to dominate an overall value of the signal, preventing the signal from having a discernable portion attributable to a data component of the signal, or leaving limited headroom for a data component of the signal in the overall value of the signal.

Examples of this description provide for an isolator circuit that mitigates radiated noise, such as may create a CM voltage in an isolating transformer. As described above, EMI induced noise induces a voltage on a circuit. In circuits including capacitive or inductive components, that voltage increases slowly with time until reaching a saturation point at which the increase ends. Thus, by limiting or reducing an amount of time available for the voltage to increase, a value of the voltage resulting from the noise may be limited or reduced. In an example, a transmitting coil of an isolating transformer may be grounded (e.g., such as by coupling each terminal of the coil to a ground terminal at which a ground voltage potential is provided), preventing the buildup of voltage attributable to noise. However, while grounded, the isolating transformer may be incapable of transmitting data from a first, or transmitting, coil to a second, or receiving, coil.

To facilitate both the reduction of noise-induced voltage, while also permitting the selective transmission of data via the isolating transformer, the transmitting coil may be grounded based in part on a value (e.g., logic 1 or logic 0) of an input signal received by the isolating transformer. For example, responsive to receipt of the input signal having an asserted value (e.g., a value of logic 1 according to a voltage domain in which the input signal is provided), the transmitting coil is decoupled from ground for an amount of time, which may be a programmed amount of time. Responsive to expiration of that programmed amount of time, the transmitting coil may again be grounded. By grounding the transmitting coil of the isolating transformer for periods of time, or portions of periods of time, in which the input signal does not have an asserted value, an amount of time available for build-up of noise-induced voltage is reduced. In some examples, the reduction in available time as described herein results in a Vpp decrease in CM voltage of approximately twenty percent.

FIG. 1 is a block diagram of an example system 100 for implementing voltage isolation. In some examples, the system 100 is representative of a single device. In other examples, the system 100 includes multiple devices. In some examples, the system 100 is representative of a digital isolator. In other examples, the system 100 is representative of a battery management system, such as may be implemented in an automobile, a solar inverter, or other systems in which EMI may exist. In an example, the system 100 includes a first device 102, an isolator (or isolator circuit) 104, and a second device 106. While described as separate devices, in some examples, the first device 102 and the second device 106 may each be sub-components of the same device. In an example architecture, the first device 102 is coupled to the isolator 104, and the second device 106 is coupled to the isolator 104. The isolator 104 may therefore communicatively couple the first device 102 to the second device 106, but without a direct, physical coupling through the isolator 104. For example, an isolation barrier (not shown) of the isolator 104 separates the first device 102 from the second device 106. Communicative coupling may be using capacitive, inductive, or other suitable coupling not having a direct current path.

In an example, the isolator 104 includes an isolating transformer (not shown) that communicatively couples the first device 102 to the second device 106. In some examples, the isolator 104 also, or alternatively, includes one or more isolating capacitors (not shown). For example, the isolating capacitors may be implemented in place of the isolating transformer to communicatively couple the first device 102 to the second device 106, or in addition to the isolating transformer to increase noise mitigation of the isolator 104. Although not shown in FIG. 1, in some examples a first portion (e.g., a transmitting portion) of the isolator 104 may be co-located with the first device 102 and a second portion (e.g., a receiving portion) of the isolator 104 may be co-located with the second device 106.

In an example of operation of the system 100, the first device 102 provides an input signal (DIN) to the isolator 104. A value of the input signal at a given point in time may correspond to a value of data at that point in time. For example, the input signal having an asserted value at a first point in time is representative of data having a value of logic 1 at that first point in time. Similarly, the input signal having a deasserted value at a second point in time is representative of data having a value of logic 0 at that second point in time. The isolator 104 transmits the data represented by the input signal to the second device 106 utilizing isolation techniques, such as using an isolating transformer.

As described above, the isolator 104 may be influenced by EMI such that at least some signals present in the isolator 104 have a noise-induced voltage component. To mitigate an increase in value of the noise-induced voltage component, and therefore its effect on transmissions by the isolator 104 (such as including data represented by the input signal) to the second device 106 and detection of the transmitted data, the isolator 104 implements techniques to mitigate increases in value of the noise-induced voltage component. In the example of an isolating transformer, increases in value of the noise-induced voltage component may be mitigated by grounding a transmitting coil (not shown) of the isolating transformer during at least a portion of a time in which the input signal does not have an asserted value. Mitigating the increases in value of the noise-induced voltage component, in some examples, reduces challenges that may arise in the transmission of the data represented by the input signal, or detection/decoding of a received signal to obtain or reconstruct the data represented by the input signal at a receiver.

Figure 2:
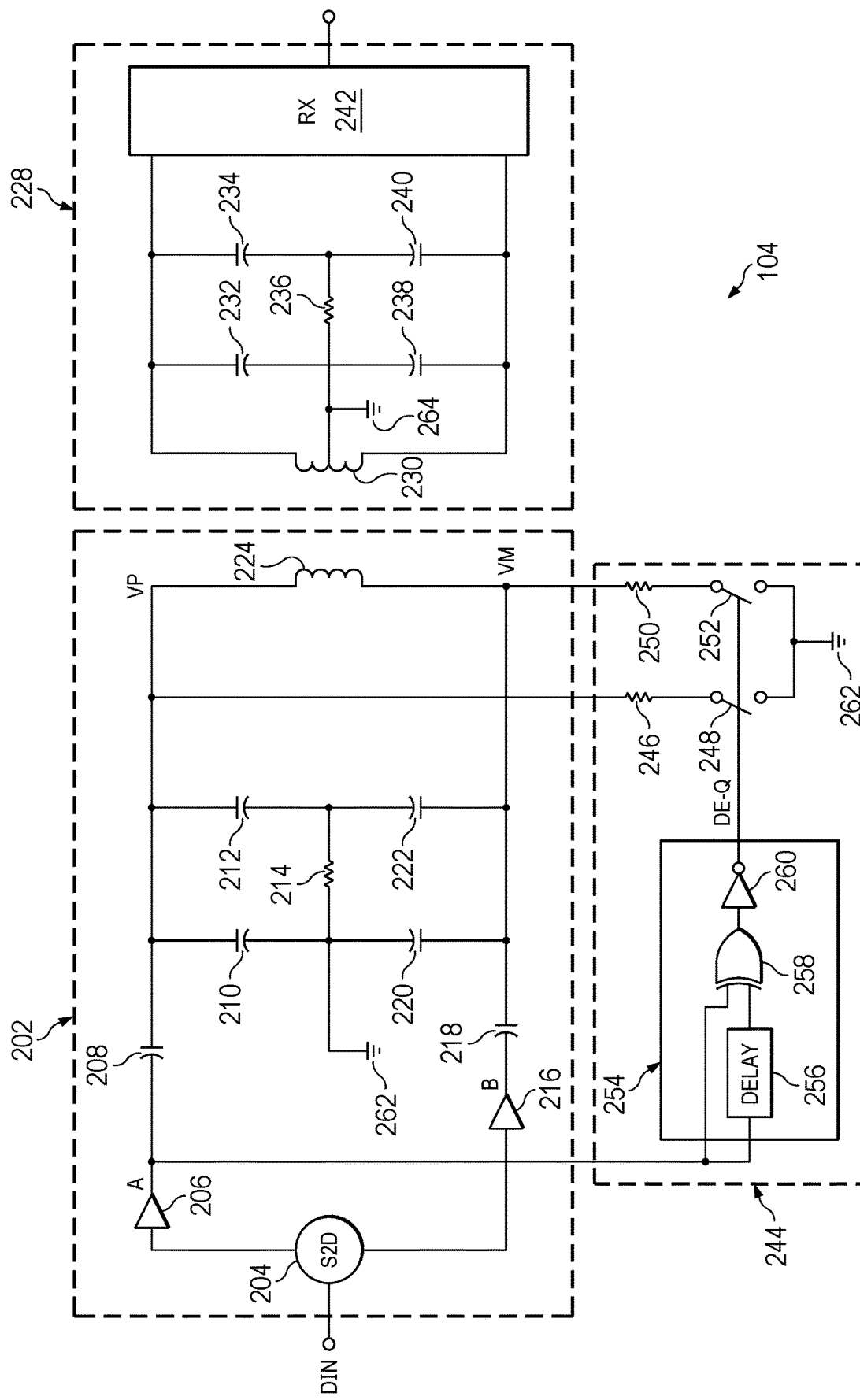
FIG. 2 is a schematic diagram of an example isolator.

FIG. 2 is a schematic diagram of an example of the isolator 104. In an example, the isolator 104 includes a transmitting portion 202, a receiving portion 228, and a grounding circuit 244. The transmitting portion 202 includes a single-to-differential (S2D) converter 204, a buffer 206, a capacitor 208, a capacitor 210, a capacitor 212, a resistor 214, a buffer 216, a capacitor 218, a capacitor 220, a capacitor 222, and a first coil (e.g., a transmitting coil) 224 of an isolating transformer 226. The receiving portion 228 includes a second coil 230 (e.g., a receiving coil) of the isolating transformer 226, a capacitor 232, a capacitor 234, a resistor 236, a capacitor 238, and a capacitor 240. In an example, the first coil 224 and the second coil 230 are each implemented as inductors. In some examples, the receiving portion 228 also includes receiver circuitry 242, such as may decode a received analog signal to provide a digital signal having a value based on the value of the analog signal. The grounding circuit 244 includes a resistor 246, a switch 248, a resistor 250, a switch 252, and a control circuit 254. The control circuit 254 includes a delay circuit 256, an exclusive-OR (XOR) logic circuit 258, and an inverter 260. In some examples, the switch 248 and the switch 252 are implemented as semiconductor devices, such as field-effect transistors (FETs), bi-polar junction transistors (BJTs), or any other suitable devices that are configurable to switch between conductive and nonconductive states.

In an example architecture of the isolator 104, the S2D converter 204 has an input and first and second outputs and includes active components (not shown) such as a first and a second operational amplifier and passive components such as resistors. In an example, the isolator 104 couples to the first device 102 at the input of the S2D converter 204. The buffer 206 has an input coupled to the first output of the S2D converter 204 and has an output. The capacitor 208 is coupled to the grounding circuit 244, and to the output of the buffer 206, and to a first terminal of the first coil 224. The capacitor 210 is coupled to the output of the buffer 206 and to a ground terminal 262 at which a first ground voltage potential is provided. The capacitor 212 is coupled to the output of the buffer 206 and to a second terminal of the resistor 214. The resistor 214 is coupled at a first terminal to the ground terminal 262. The buffer 216 has an input coupled to the second output of the S2D converter 204 and an output. The capacitor 218 is coupled to the output of the buffer 216 and to a second terminal of the first coil 224. The capacitor 220 is coupled to the output of the buffer 216 and to the ground terminal 262. The capacitor 222 is coupled to the output of the buffer 216 and to the second terminal of the resistor 214.

The receiver circuitry 242 has a first input coupled to a first terminal of the second coil 230, has a second input coupled to a second terminal of the second coil 230, and has an output. The capacitor 232 is coupled to the first terminal of the second coil 230 and to a first terminal of the resistor 236. The capacitor 234 is coupled to the first terminal of the second coil 230 and to a second terminal of the resistor 236. The capacitor 238 is coupled to the second terminal of the second coil 230 and to the first terminal of the resistor 236. The capacitor 240 is coupled to the second terminal of the second coil 230 and to the second terminal of the resistor 236. The first terminal of the resistor 236 is coupled to a ground terminal 264 and to a center tap of the second coil 230. A second ground potential is provided at ground terminal 264, which may be different from the first ground potential provided at ground terminal 262.

The grounding circuit 244 is coupled to the output of the buffer 206 and to the first and second terminals of the first coil 224. For example, the resistor 246 is coupled to the first terminal of the first coil 224 and to the switch 248. The switch 248 is coupled to the resistor 246 and to and the ground terminal 262. The resistor 250 is coupled to the second terminal of the first coil 224 and to the switch 252. The switch 252 is coupled to the resistor 250 and the ground terminal 262. The delay circuit 256 has an input coupled to the output of the buffer 206, and has an output. The XOR logic circuit 258 has a first input coupled to the output of the buffer 206, has a second input coupled to the output of the delay circuit 256, and has an output. The inverter 260 has an input coupled to the output of the XOR logic circuit 258 and has an output coupled to control terminals of the switch 248 and the switch 252.

In an example of operation of the isolator 104, the S2D converter 204 receives DIN at a data input of the isolator 104. In some examples, DIN is received by the isolator 104 as single-ended, digital data. In such examples, the S2D converter 204 converts DIN to a representation in a differential format, providing a first (e.g., positive) component of a differential signal to the input of the buffer 206 and a second (e.g., negative) component of the differential signal to the input of the buffer 216. In other examples, DIN is received by the isolator 104 as a differential signal. In examples in which DIN is received as a differential signal, the S2D converter 204 may be omitted such that a first (e.g., positive) component of the differential signal is received at the input of the buffer 206 and a second (e.g., negative) component of the differential signal is received at the input of the buffer 216.

The buffer 206 provides a buffered representation of the first component of the differential signal (A) to the capacitor 208. The capacitor 208 performs alternating current (AC) coupling to provide the first component of the differential signal to the first terminal of the first coil 224. Similarly, the buffer 216 provides a buffered representation of the second component of the differential signal (B) to the capacitor 218. The capacitor 218 performs AC coupling to provide the second component of the differential signal to the second terminal of the first coil 224.

Although shown in FIG. 2 as physical components, in some examples the capacitors 210, 212, 220, and 222 are not physical capacitors, but rather inherent characteristics of the transmitting portion 202. For example, the capacitors 210 and 220 may be representative of parasitic capacitances resulting from metal routings, traces, or other interconnects of the transmitting portion 202, and the capacitors 212 and 222 may be representative of parasitic capacitances resulting from the first coil 224. Similarly, the capacitors 232 and 238 may be representative of parasitic capacitances resulting from the second coil 230, and the capacitors 234 and 240 may be representative of parasitic capacitances resulting from metal routings, traces, or other interconnects of the receiving portion 228.

In an example, in a default state, the first coil 224 is grounded through the grounding circuit 244. Accordingly, the first coil 224 is coupled at its first terminal through the resistor 246 and the switch 248 to the ground terminal 262, and is coupled at its second terminal through the resistor 250 and the switch 252 to the ground terminal 262. Such coupling may ground the first coil 224, preventing the buildup of noise-induced voltage, as described above, during a period of the coupling. Responsive to the buffered representation of the first component of the differential signal having an asserted value, the grounding of the first coil 224 is released. The first coil 224 may radiate energy to the second coil 230 responsive to the grounding of the first coil 224 being released.

For example, responsive to the buffered representation of the first component of the differential signal having an asserted value, the control circuit 254 controls the switch 248 and the switch 252 to open, decoupling the first coil 224 from the ground terminal 262. Responsive to a programmed amount of time elapsing after the decoupling, the control circuit 254 controls the switch 248 and the switch 252 to close, coupling the first coil 224 to the ground terminal 262 at both first and second terminals. In some examples, the programmed amount of time is determined by the delay circuit 256. For example, the delay circuit 256 may have any suitable architecture for implementing a programmed, time-based delay period, the scope of which is not limited herein. In an example, the programmed delay implemented by the delay circuit 256 has a relationship to the frequency of the buffered representation of the first component. For example, for a buffered representation of the first component having a frequency of F, the delay circuit 256 has a programmed delay to cause an output of the XOR logic circuit 258 to have a frequency of approximately F/x, where x is any suitable value determined to cause the switch 248 and the switch 252 to open for approximately a programmed number of cycles of VP and VM. In some examples, x is approximately equal to 2, and the programmed number of cycles is in a range of 2 to 5.

In an example, responsive to being decoupled from ground by the grounding circuit 244, the first coil 224 radiates energy based on the buffered representation of the differential signal (e.g., the buffered representation of the first component of the differential signal and the buffered representation of the first component of the differential signal). As described above, the buffered representation of the differential signal includes a data component representative of DIN, as described above, and a noise-induced component resulting from electromagnetic interference, circuit parasitics, or other signal noise sources. Increases in value of the noise-induced component may be mitigated based on the grounding of the first coil 224, as described herein. In some examples, the second coil 230 receives the energy radiated by the first coil 224, or a portion of the energy radiated by the first coil 224. In some examples, the second coil 230 provides signals at the first and second terminals of the second coil 230 as an output signal of the isolator 104 based on the received radiated energy. In such examples, the receiver circuitry 242 may be omitted. In other examples, the signals at the first and second terminals of the second coil 230 are provided as a differential signal to the receiver circuitry 242. The receiver circuitry 242 processes the differential signal to decode the differential signal and reconstruct data represented in DIN. Based on the decoding, the receiver circuitry 242 provides a digital signal representative of the data represented in DIN. Any suitable architecture and operation of the receiver circuitry 242 based on a received signal having the characteristics described herein may be possible, the scope of which is not limited herein. The output signal of the isolator 104, whether provided by the isolating transformer 226 or the receiver circuity 242, may be received and processed by another device, such as the second device 106.

The control circuit 254 is shown in FIG. 2 as having discrete components (e.g., the delay circuit 256, the XOR logic gate 258, and the inverter 260). However, in other examples, the control circuit 254 is implemented according to any other suitable architecture that provides control as described herein. In some examples, the control circuit 254 is implemented as a field programmable gate array (FPGA) programmed or configured to implement the control as described herein. In other examples, the control circuit 254 is implemented as a processor that executes instructions to implement the control as described herein.

Figure 3:
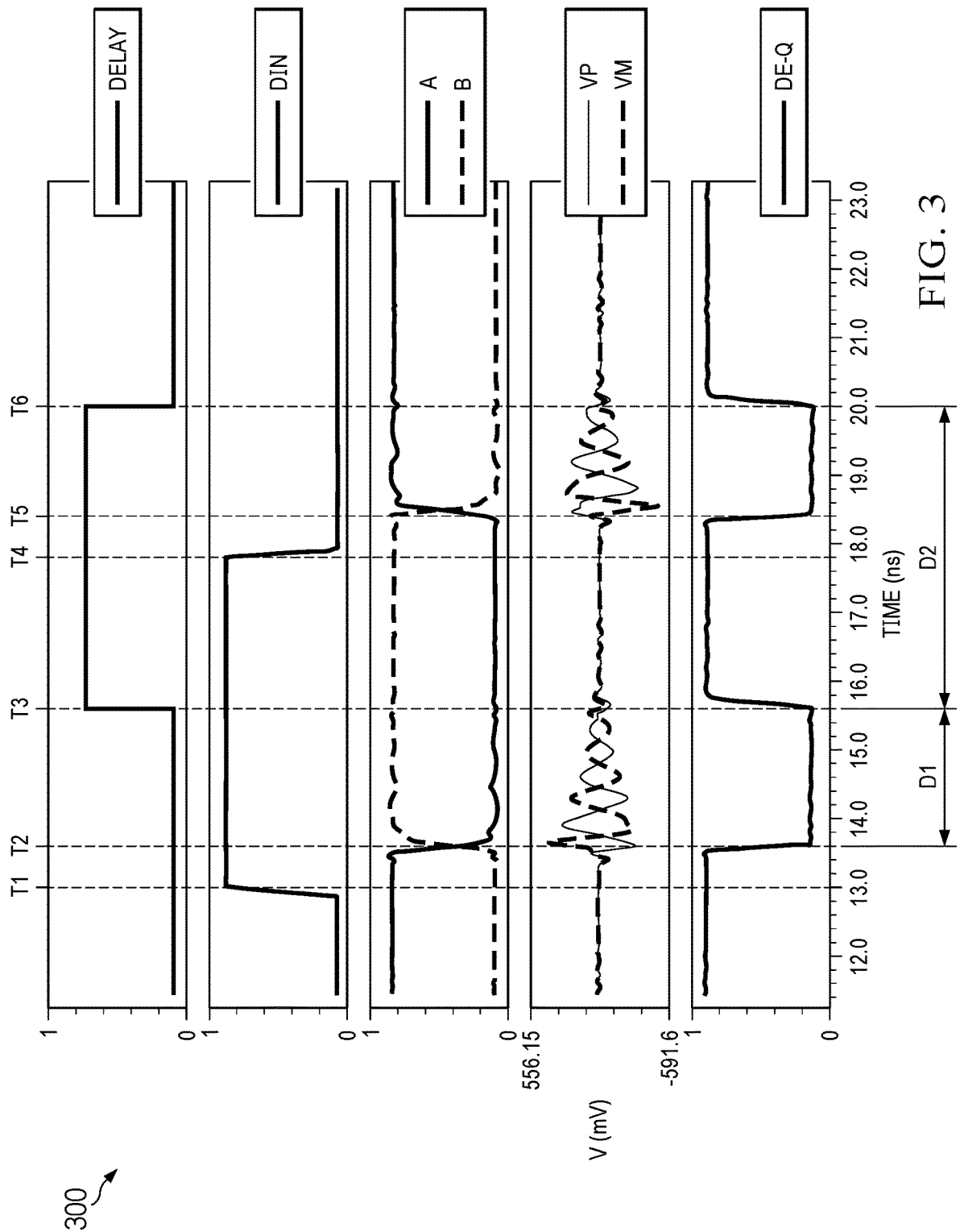
FIG. 3 is a timing diagram of example signals in a system for implementing voltage isolation.

FIG. 3 is a timing diagram 300 of example signals in a system for implementing voltage isolation. In some examples, at least some of the signals of the timing diagram 300 are representative of signals that may be provided or otherwise present in the isolator 104. The timing diagram 300 includes DIN, a signal A representative of an output provided by the buffer 206, a signal B representative of an output provided by the buffer 216, a signal VP representative of a voltage provided at the first terminal of the first coil 224, a signal VM representative of a voltage provided at the second terminal of the first coil 224, a signal DE-Q representative of an output of the control circuit 254, and a signal DELAY representative of an output signal of the delay circuit 256. DIN, A, B, DE-Q, and DELAY are each shown having a vertical axis representative of a logic value state of asserted (e.g., logic 1) or deasserted (e.g., logic 0) and a horizontal axis representative of time in units of nanoseconds (ns). VP and VM are each shown having a vertical axis representative of voltage in units of millivolts (mV) and a horizontal axis representative of time in units of ns.

As shown in FIG. 3, DIN is converted by the S2D converter 204 to the differential form, upon which the buffer 206 and the buffer 216 provide A and B, respectively. In some examples, a delay exists between a rising edge of DIN and a corresponding rising edge of A. Responsive to A having a deasserted value, the delay circuit 256 is inactive and provides DELAY having a deasserted value. Responsive thereto, the XOR logic circuit 258 provides an output signal having a deasserted value. The inverter 260 provides an output signal having an asserted value, represented in FIG. 3 as DE-Q, based on the deasserted output signal of the XOR logic circuit 258. The switches 248, 252 close responsive to the asserted value of DE-Q, grounding the first coil 224, as described herein. While DE-Q has an asserted value, substantially no energy is provided at the first and second terminals of the first coil 224, thus mitigating the buildup of noise-induced voltage components at the first coil 224

At time T1, DIN transitions to an asserted value. Responsive to DIN having an asserted value, at time T2, A transitions to an asserted value. Responsive thereto, the delay circuit 256 activates and the XOR logic circuit 258 provides a an output signal having an asserted value. The inverter 160 provides DE-Q having a deasserted value based on the asserted output signal of the XOR logic circuit 258. The switches 248, 252 open responsive to the deasserted value of DE-Q, releasing the grounding of the first coil 224, as described herein, and permitting the buildup of VP and VM as shown for transmission by the first coil 224.

In some examples, the delay circuit 256 is programmed to implement a delay period of D1 following its activation. In some examples, D1 has a relationship to a frequency of DIN or of A, as described above. Responsive to expiration of D1, at T3 the delay circuit 256 provides DELAY having an asserted value. Responsive to both A and DELAY having asserted values, the XOR logic circuit 258 provides an output signal having a deasserted value, to which the inverter 160 and the switches 248, 252 respond, as described above. In an example, the delay circuit 256 provides DELAY having an asserted value for a programmed amount of time D2. In some examples, D2 is determined according to a hardware architecture of the delay circuit 256, such as a resistor-capacitor or other time constant of the delay circuit 256. In some examples, component values of the delay circuit 256 (such as resistance values, capacitance values, etc.) are controlled to also program D2.

At time T4, DIN transitions to have a deasserted value. Responsive to DIN having a deasserted value, at time T5 A transitions to have a deasserted value. Responsive thereto, the XOR logic circuit 258 provides an output signal having an asserted value, to which the inverter 160 and the switches 248, 252, respond as described above. At time T6, the period D2 expires and the delay circuit 256 provides DELAY having a deasserted value. Responsive to both A and DELAY having deasserted values, the XOR logic circuit 258 provides an output signal having a deasserted value, to which the inverter 160 and the switches 248, 252, respond as described above.

Figure 4:
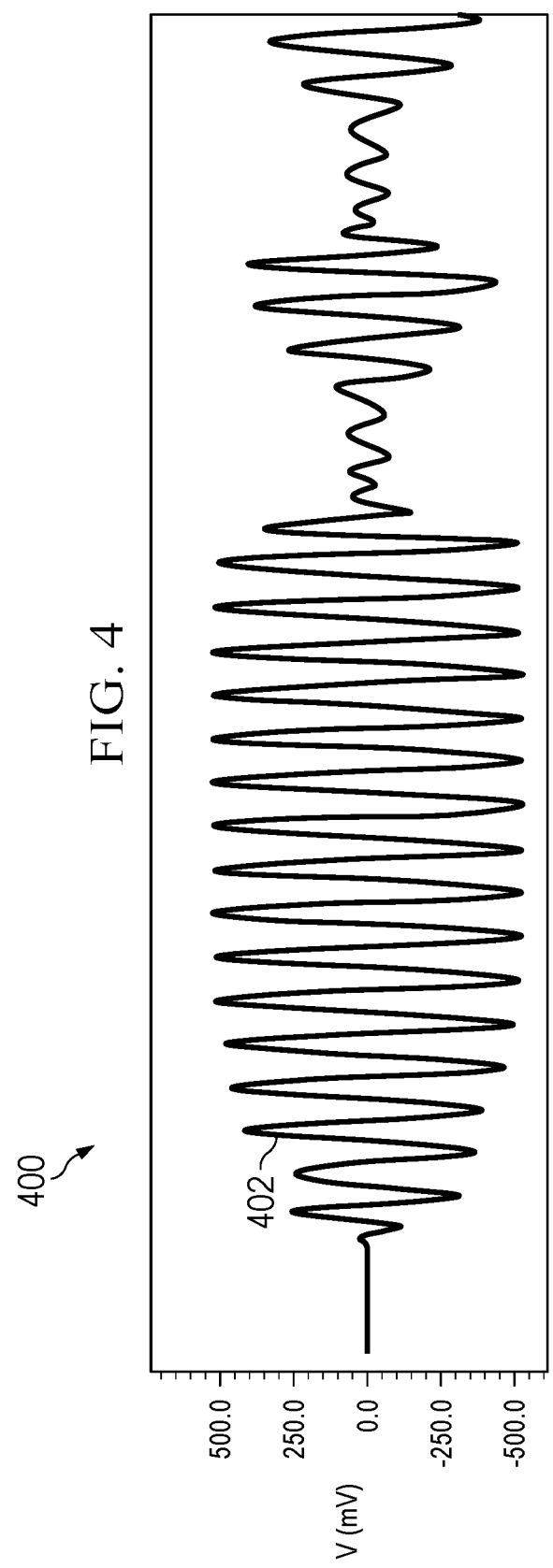
FIG. 4 is a timing diagram of example signals in a system for implementing voltage isolation.

FIG. 4 is a timing diagram 400 of example signals in a system for implementing voltage isolation. In some examples, at least some of the signals of the timing diagram 400 are representative of signals that may be provided or otherwise present in the isolator 104. The timing diagram 400 includes a signal 402 representative of a CM voltage received at receiving portion 228 and DE-Q, as described above. Signal 402 is shown having a vertical axis representative of voltage in units of mV and a horizontal axis representative of time in units of ns. DE-Q is shown as a digital signal having a value of logic 0 or logic 1.

FIG. 4 shows four time periods, T7, T8, T9, and T10. During T7, the grounding circuit 244 is inactive. Accordingly, the signal 402 in the time period T7 may be representative of a CM voltage of a signal received at a receiver in a system that does not include the grounding circuit 244. The received signal may be based on a transmitted signal, having been transmitted based on DIN. As described above herein, EMI induces noise in a source of the signal 402. That noise can create a CM voltage of the signal 402 having a Vpp sufficiently large to cause saturation of the isolating transformer 226 and/or supporting components of the isolating transformer 226, such as shown in the time period T7. Responsive to assertion of DE-Q, the signal 402 decreases in value, resulting from the grounding of the first coil 224. This decrease is shown in the time period T8. Responsive to receipt of DIN having an asserted value, DE-Q is deasserted and the signal 402 begins to increase in value. This increase in value is shown in the time period T9. A portion of the increase in value of signal 402 may be attributable to EMI-induced noise and a portion of the increase in value of signal 402 may be attributable to DIN. Responsive to assertion of DE-Q, the signal 402 again decreases in value, resulting from the grounding of the first coil 224. This decrease is shown in the time period T10. In some examples, absent DE-Q being asserted again during T10 the signal 402 may return to a saturated state as shown in T7. As described above, grounding the first coil 224 may prevent the signal 402 from having a CM voltage with a Vpp sufficiently large to cause saturation of the isolating transformer 226 and/or supporting components of the isolating transformer 226, inhibiting the receipt of interpretation of received data.

Figure 5:
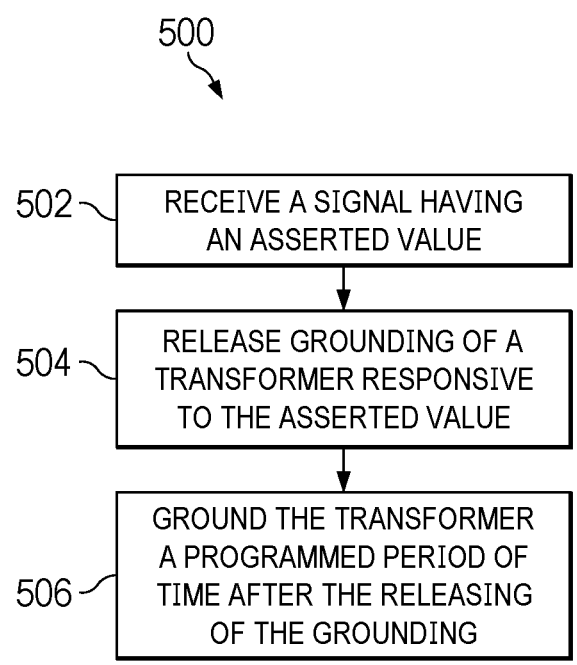
FIG. 5 is a flow diagram of an example method of voltage isolation.

FIG. 5 is a flow diagram of an example method 500 of voltage isolation. In some examples, the method 500 is implemented by an isolator, such as the isolator 104. In some examples, a grounding circuit, such as the grounding circuit 244, of the isolator at least partially implements the method 500.

In some examples, instructions to implement the method 400 may be stored as machine readable instructions in a non-transitory machine readable medium. The instructions may be executable by a processing circuit to implement at least a portion of the method 400. The processing circuit may be a processor, a microprocessor, a controller, a FPGA, or the like.

At operation 502, a signal having an asserted value is received. In some examples, the signal is a component of a differential signal, such as a positive component of a differential signal (e.g., signal A, as described above). While described herein as receiving a signal having an asserted value, in various examples, a deasserted value may instead be received, such as of a negative component of the differential signal.

At operation 504, grounding of a coil of a transformer is released responsive to the asserted value. In an example, the grounding circuit grounds the coil by coupling each terminal of the coil to ground through a respective switch. The grounding circuit may control a state of the switch (e.g., open or closed) responsive to the asserted value. For example, responsive to the asserted value, the grounding circuit may activate a delay circuit that provides a delay signal having an asserted value a programmed period of time after activation of the delay circuit, as described above herein. Responsive to only one of the data signal or the delay signal having an asserted value, the grounding circuit controls the switches to open, releasing the grounding of the coil (e.g., decoupling the coil from the ground terminal). In an example of the method 400 which is stored as machine readable instructions and executed by a processor, releasing the grounding of the coil of the transformer includes providing a signal that causes the grounding to be released, such as providing a signal having the characteristics of DE-Q, as described herein.

At operation 506, responsive to expiration of the programmed period of time, the coil of a transformer is grounded. For example, responsive to both the data signal and the delay signal, or neither the data signal or the delay signal, having asserted values, the grounding circuit controls the switches to close, coupling the coil to the ground terminal and grounding the coil. In an example of the method 400 which is stored as machine readable instructions and executed by a processor, grounding the coil of the transformer includes providing a signal that causes the coil of the transformer to be grounded, such as providing a signal having the characteristics of DE-Q, as described herein.

In this description, the term "couple" may cover connections, communications, or signal paths that enable a functional relationship consistent with this description. For example, if device A provides a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. An apparatus, comprising:
an isolating transformer having a first coil, the first coil having first and second terminals;
a first resistor having first and second terminals, the first terminal of the first resistor coupled to the first terminal of the first coil;
a second resistor having first and second terminals, the first terminal of the second resistor coupled to the second terminal of the first coil;
a first switch having a control terminal, having a first terminal coupled to the second terminal of the first resistor, and having a second terminal coupled to a ground terminal;
a second switch having a control terminal, having a first terminal coupled to the second terminal of the second resistor, and having a second terminal coupled to the ground terminal; and
a control circuit coupled to the first terminal of the first coil and coupled to the control terminals of the first and second switches.

2. The apparatus of claim 1, wherein the control circuit includes:
a delay circuit having an input coupled to the first terminal of the first coil, and having an output;
an exclusive OR (XOR) circuit having a first input coupled to the input of the delay circuit and coupled to the first terminal of the first coil, having a second input coupled to the output of the delay circuit, and having an output; and
an inverter having an input coupled to the output of the XOR circuit, and having an output coupled to the control terminals of the first and second switches.

3. The apparatus of claim 2, further comprising a first buffer having an output coupled to the first terminal of the first coil, to the first input of the XOR circuit, and to the input of the delay circuit.

4. The apparatus of claim 3, further comprising a second buffer having an output coupled to the second terminal of the first coil.

5. The apparatus of claim 4, further comprising a single-to-differential converter (S2D) having a first output coupled to an input of the first buffer input, and having a second output coupled to an input of the second buffer input.

6. The apparatus of claim 4, further comprising:
a first capacitor having a first terminal coupled to the output of the first buffer and a second terminal coupled to the first terminal of the first coil; and
a second capacitor having a first terminal coupled to the output of the second buffer and a second terminal coupled to the second terminal of the first coil.

7. The apparatus of claim 1, wherein the isolating transformer has a second coil, the second coil having third and fourth terminals, and having a center tap coupled to a ground terminal,
the apparatus further comprising a receiver having a first input coupled to the third terminal and a second input coupled to the fourth terminal.

8. An apparatus, comprising:
an isolating transformer having first and second coils separated by an isolation barrier, the first coil having first and second terminals;
a first switch coupled to the first terminal of the first coil and coupled to the ground terminal, and having a control terminal;
a second switch coupled to the second terminal of the first coil and coupled to the ground terminal, and having a control terminal; and
a control circuit having an input coupled to the first terminal of the first coil and having an output coupled to the control terminals of the first and second switches.

9. The apparatus of claim 8, wherein
the control circuit is configured to open the first and second switches responsive to receipt by the apparatus of an input signal having an asserted value.

10. The apparatus of claim 8, wherein the first switch has a second terminal coupled to the ground terminal and has a first terminal, and the second switch has a second terminal coupled to the ground terminal and has a first terminal, and the apparatus further comprising:
a first resistor having first and second terminals, the first terminal of the first resistor coupled to the first terminal of the first coil and the second terminal of the first resistor coupled to the first terminal of the first switch;
a second resistor having first and second terminals, the first terminal of the second resistor coupled to the second terminal of the first coil and the second terminal of the second resistor coupled to the first terminal of the second switch.

11. The apparatus of claim 8, wherein the control circuit includes:
a delay circuit having an input coupled to the data input and having an output;
an exclusive OR (XOR) circuit having a first input coupled to the data input, a second input coupled to the delay circuit output, and having an output; and
an inverter having an input coupled to the XOR output and having an output coupled to a control terminal of the first switch and a control terminal of the second switch.

12. The apparatus of claim 11, further comprising:
a first buffer having an input coupled to the delay circuit input, and having an output;
a first capacitor having a first terminal coupled to output of the first buffer and having a second terminal coupled to the first terminal of the first coil.

13. The apparatus of claim 12, further comprising:
a second buffer having an input and having an output;
a second capacitor having a first terminal coupled to the output of the second buffer and a second terminal coupled to the second terminal of the first coil.

14. The apparatus of claim 13, further comprising a single-to-differential converter (S2D) having a first output coupled to the input of the first buffer, and a second output coupled to the input of the second buffer.

15. The apparatus of claim 11, wherein the delay circuit is configured to:
begin a delay period having a first programmed duration in response to receipt of a signal at the data input;
responsive to expiration of the delay period, provide a delay signal having an asserted value for a second programmed duration; and
responsive to expiration of the second programmed duration, provide the delay signal having a deasserted value.

16. A method, comprising:
receiving, into a control circuit, a signal having an asserted value, wherein a representation of the signal is provided to a first terminal of a transformer coil;
decoupling the first terminal of the transformer coil from a ground terminal responsive to the signal into the control circuit having the asserted value; and
coupling the first terminal of the transformer coil to the ground terminal a programmed period of time after the decoupling.

17. The method of claim 16, wherein the first terminal of the transformer coil is coupled through a first switch to the ground terminal, and the method further comprising coupling a second terminal of the transformer coil through a second switch to the ground terminal.

18. The method of claim 17, further comprising:
controlling the first switch and the second switch to open responsive to the signal having an asserted value and a delayed representation of the signal having a deasserted value, wherein the delayed representation of the signal is delayed from the signal by the programmed period of time; and
controlling the first switch and the second switch to close responsive to the delayed representation of the signal each having an asserted value.

19. The method of claim 17, further comprising controlling the first switch and the second switch to open responsive to the signal having a deasserted value and the delayed representation of the signal having an asserted value.

20. The method of claim 17, further comprising controlling the first switch and the second switch to close responsive to the signal and the delayed representation of the signal each having an asserted value or neither the signal nor the delayed representation of the signal having an asserted value.

* * * * *